(12) United States Patent
Lee

(10) Patent No.: US 9,748,485 B2
(45) Date of Patent: Aug. 29, 2017

(54) MASK FRAME ASSEMBLY AND METHOD OF MANUFACTURING ORGANIC LIGHT-EMITTING DISPLAY APPARATUS USING THE SAME

(71) Applicant: Samsung Display Co., Ltd., Yongin-si (KR)

(72) Inventor: Daewon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/172,049

(22) Filed: Jun. 2, 2016

(65) Prior Publication Data

US 2017/0110661 A1 Apr. 20, 2017

(30) Foreign Application Priority Data

Oct. 16, 2015 (KR) .................. 10-2015-0144737

(51) Int. Cl.
*H01L 51/00* (2006.01)
*H01L 51/56* (2006.01)
*C23C 14/24* (2006.01)
*C23C 14/04* (2006.01)
*B05B 15/04* (2006.01)
*H01L 27/32* (2006.01)

(52) U.S. Cl.
CPC ........ *H01L 51/0011* (2013.01); *B05B 15/045* (2013.01); *B05B 15/0437* (2013.01); *C23C 14/042* (2013.01); *C23C 14/24* (2013.01); *H01L 51/0004* (2013.01); *H01L 51/56* (2013.01); *H01L 27/3244* (2013.01); *H01L 2227/323* (2013.01)

(58) Field of Classification Search
CPC ..... H01L 2224/7501; H01L 2224/7601; H01L 2224/7701; H01L 2224/7801
See application file for complete search history.

(56) References Cited

U.S. PATENT DOCUMENTS

2012/0279444 A1 11/2012 Hong

FOREIGN PATENT DOCUMENTS

| KR | 10-2009-0059225 | 6/2009 |
|---|---|---|
| KR | 10-1097305 | 12/2011 |
| KR | 10-2012-0021055 | 3/2012 |
| KR | 10-2012-0125035 | 11/2012 |
| KR | 10-1504544 | 3/2015 |

*Primary Examiner* — Cheung Lee
(74) *Attorney, Agent, or Firm* — H.C. Park & Associates, PLC

(57) ABSTRACT

A mask frame assembly includes a frame, an open mask, and stick masks. The open mask is supported by the frame. The stick masks are disposed on the open mask and include ends coupled to the frame. The open mask includes: a first opening disposed in association with opposing ends of the open mask; and a second opening disposed between the first openings, the second opening being larger than the first opening. First deposition patterns of a first stick mask of the stick masks and second deposition patterns of a second stick mask of the stick masks overlap the second opening.

7 Claims, 7 Drawing Sheets

MASK FRAME ASSEMBLY AND METHOD OF MANUFACTURING ORGANIC LIGHT-EMITTING DISPLAY APPARATUS USING THE SAME

CROSS-REFERENCE TO RELATED APPLICATION

This application claims priority from and the benefit of Korean Patent Application No. 10-2015-0144737, filed on Oct. 16, 2015, which is hereby incorporated by reference for all purposes as if fully set forth herein.

BACKGROUND

Field

Exemplary embodiments relate to a method and apparatus, and, more particularly, to a mask frame assembly and a method of manufacturing an organic light-emitting display apparatus using the same.

Discussion of the Background

Mobile electronic devices, such as mobile phones, notebook computers, personal digital assistants, tablets, etc., are widely used. These devices typically include a display unit to provide users with visual information, such as an image or video information, in order to support various functions. Components for driving display units have become smaller, but the display units themselves have become more important in conventional mobile electronic devices. It is also noted that a structure for bending a display unit from a first (e.g., flat) state to a second (e.g., bended at a certain angle) state has been developed.

A conventional organic light-emitting diode (OLED) display apparatus may be manufactured using a vacuum deposition process performed by depositing an organic material or a metal material that may be used as an organic layer or an electrode on a substrate in a vacuum environment to form a thin film on the substrate. The vacuum deposition process may be performed by locating a substrate upon which an organic thin film is to be formed in a vacuum chamber, adhering a fine metal mask (FMM) to the substrate (or over the substrate), and depositing an organic material on the substrate by evaporating or sublimating the organic material using a deposition source. The FMM typically will have the same (or a similar) pattern as a pattern to be formed as the organic thin film.

Typically, the vacuum deposition processes are repeatedly performed with the same mask, however, the mask will usually also be repeatedly cleaned and/or replaced with a new mask to ensure the mask will not contaminate the layer being formed and will be of sufficient durability to provide an accurate pattern. It is noted, however, that the mask may be deformed in the deposition process or the cleaning process. As such, the durability of the mask may deteriorate and the precision of the deposition process may decrease.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a mask frame assembly with improved durability and configured to enable a precise deposition pattern on a substrate.

One or more exemplary embodiments provide a method of manufacturing an organic light-emitting display apparatus using the mask frame assembly.

Additional aspects will be set forth in part in the description which follows and, in part, will be apparent from the description, or may be learned by practice of the presented inventive concept.

According to one or more exemplary embodiments, a mask frame assembly includes a frame, an open mask, and stick masks. The open mask is supported by the frame. The stick masks are disposed on the open mask and include ends coupled to the frame. The open mask includes: a first opening disposed in association with opposing ends of the open mask; and a second opening disposed between the first openings, the second opening being larger than the first opening. First deposition patterns of a first stick mask of the stick masks and second deposition patterns of a second stick mask of the stick masks overlap the second opening.

According to one or more exemplary embodiments, a method of manufacturing an organic light-emitting display apparatus includes: causing, at least in part, a deposition material to be deposited on a substrate of the organic light-emitting display apparatus according to deposition patterns formed in a mask frame assembly. The mask frame assembly includes: a frame; an open mask on the frame; and stick masks disposed on the open mask and coupled to the frame, the deposition patterns being formed in the stick masks and overlapping openings in the open mask. The method further including causing, at least in part, gases to be sprayed toward the stick masks after depositing the deposition material on the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
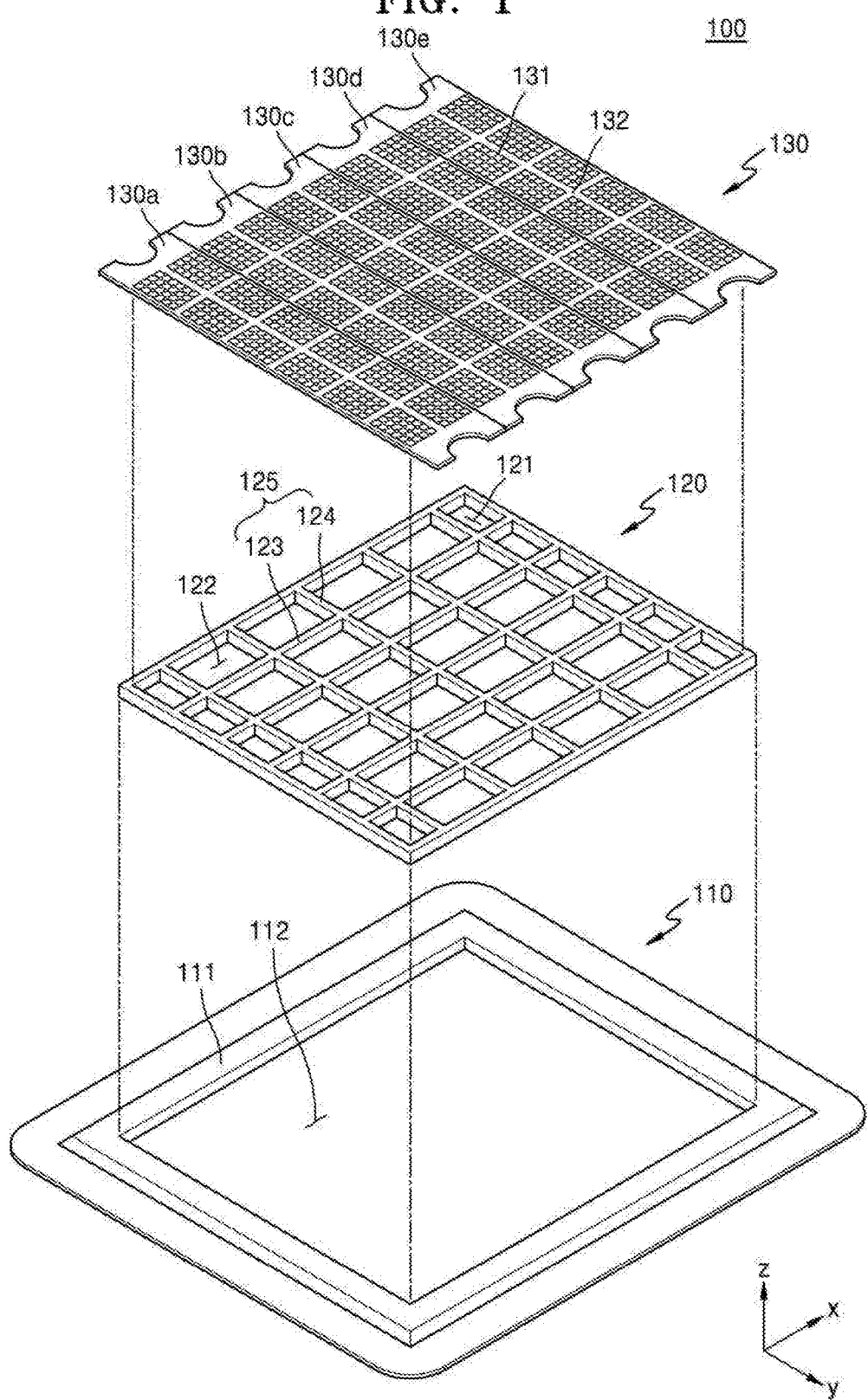
FIG. 1 is an exploded perspective view of a mask frame assembly, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to mask frame assemblies that may be utilized to fabricate an organic light emitting display apparatus, it is contemplated that various exemplary embodiments are also applicable to semiconductor devices and display devices in general, such as, for example, liquid crystal displays, plasma displays, field emission displays, electrophoretic displays, electrowetting displays, etc.

Figure 2:
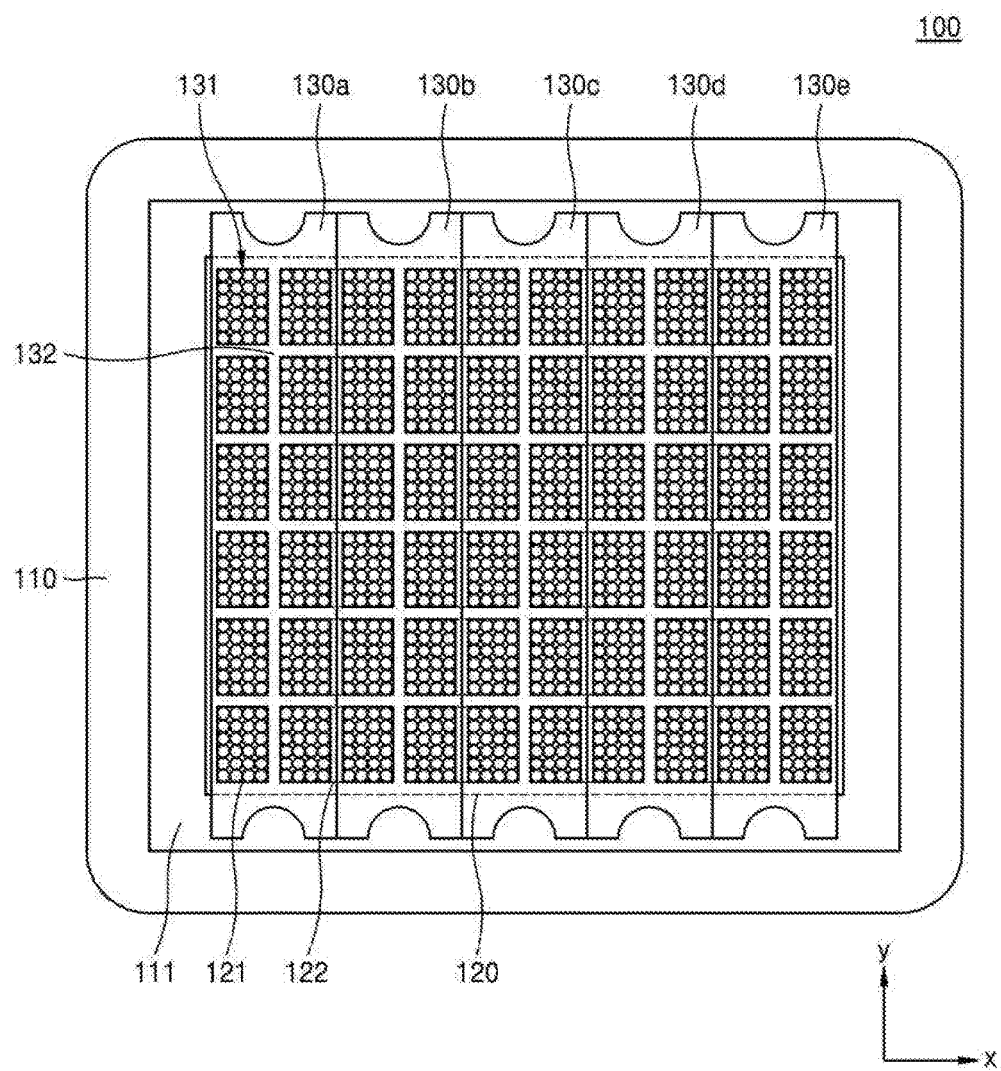
FIG. 2 is a plan view of the mask frame assembly of FIG. 1, according to one or more exemplary embodiments.

FIG. 1 is an exploded perspective view of a mask frame assembly, according to one or more exemplary embodiments. FIG. 2 is a plan view of the mask frame assembly of FIG. 1, whereas FIG. 3 is a plan view of a portion of an open mask and stick masks of FIG. 1, according to one or more exemplary embodiments.

Figure 3:
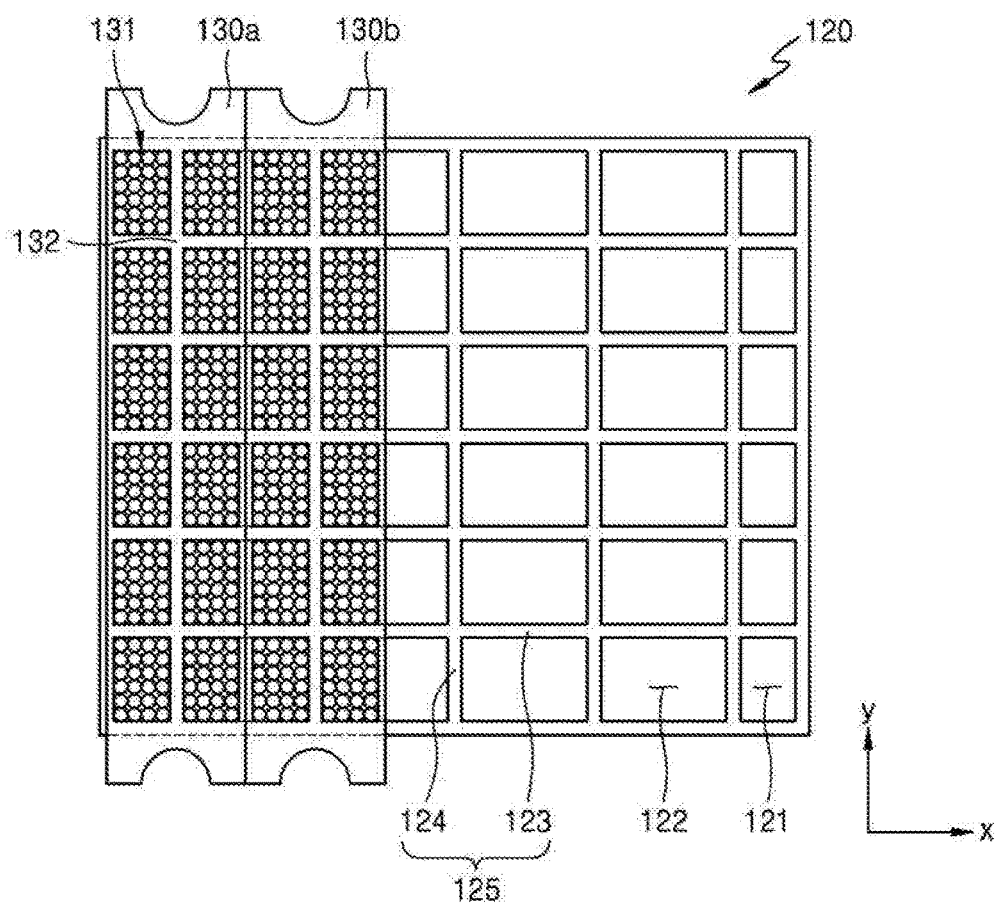
FIG. 3 is a plan view of a portion of an open mask and stick masks of FIG. 1, according to one or more exemplary embodiments.

Referring to FIGS. 1 through 3, the mask frame assembly 100 includes a frame 110, an open mask 120, and stick masks 130.

The frame 110 may be formed of any suitable material, such as metal or synthetic resin, etc., and may have a quadrangular shape having at least one opening. However, exemplary embodiments are not limited thereto. For instance, the frame 110 may be formed having various shapes, such as a circular shape, a hexagonal shape, etc. However, for descriptive convenience, an example in which the frame 110 has a quadrangular shape will be discussed. The frame 110 may include a protrusion part 111 to which the stick masks 130 may be fixed (or otherwise coupled), and an opening 112 defined by the protrusion part 111. The open mask 120 may be disposed in the opening 112. The frame 110 may include long sides extending in a first (e.g., x axis) direction and facing each other, and short sides extending in a second (e.g., y axis) direction and facing each other.

The open mask 120 may be supported by the frame 110. The open mask 120 may include first opening parts 121 disposed at (or near) ends of the open mask 120 and second opening parts 122 disposed between the first opening parts 121. Each of the first opening part 121 and the second opening part 122 may be formed in multiple numbers. The number of first opening parts 121 and the number of second opening parts 122 are not limited to a particular number, and may vary depending on a size of the mask frame assembly 100 and/or the stick masks 130, as well as a configuration of, for example, a display apparatus to be formed. It is noted, however, for descriptive convenience, an example in which six first opening parts 121 are spaced apart from one another in the second direction, and four rows of second opening parts 122 are spaced part from one another in the first direction, each row including six second opening parts 122 spaced apart from one another in the second direction.

The open mask 120 may also include a supporter 125, which may be disposed between the first opening parts 121, between the second opening parts 122, or between the first opening part 121 and the second opening part 122. The supporter 125 may support at least a portion of an outer edge of a deposition pattern part 131, as will become more apparent below. The supporter 125 may include a first supporter 123 extending in the first direction and a second supporter 124 extending in the second direction. The first opening parts 121 and/or the second opening parts 122 may be surrounded by the first supporters 123 and the second supporters 124. The first opening parts 121 may be disposed at (or near) ends of the open mask 120 in the first direction. A plurality of the first opening parts 121 may be arranged in a row in the second direction. The second opening parts 122 may be disposed between the first opening parts 121.

An area of the first opening part 121 may be smaller than an area of the second opening part 122. A length of the second opening part 122 in the second direction may be the same as a length of the first opening part 121 in the second direction, whereas a length of the second opening part 122 in the first direction may be greater than a length of the first opening part 121 in the first direction. For instance, the area of the second opening part 122 may be twice as large as the area of the first opening part 121. The area of the first opening part 121 may be larger or smaller than the deposition pattern part 131 formed in the plurality of stick masks 130. At least two deposition pattern parts 131 may be disposed on the second opening part 122, and, as such, the area of the second opening part 122 may be twice as large as the area of the first opening part 121. It is contemplated, however, that the respective dimensions of the first opening part 121 and the second opening part 122 may be altered based on, for instance, a display apparatus to be manufactured.

The plurality of stick masks 130 may be disposed in parallel to each other in the second direction. The number of stick masks 130 is not limited to a particular number, and may vary depending on a size of the open mask 120 or the deposition pattern part 131. However, for descriptive convenience, an example including five stick masks 130 disposed on the open mask 120 will be described. Further, adjacent deposition pattern parts 131 may be spaced apart from one another by septa 132. In this manner, each deposition pattern part 131 may include a plurality of deposition features (e.g., through holes) that may also be spaced apart from one another within a region of the deposition pattern part 131. A first stick mask 130*a* and a fifth stick mask 130*e* may be disposed at (or near) ends of the open mask 120. A second stick mask 130*b*, a third stick mask 130*c*, and a fourth stick mask 130*d* may be disposed between the first mask stick 130*a* and the fifth stick mask 130*e*.

At least one of the deposition pattern parts 131 of the first stick mask 130*a* and the fifth stick mask 130*e* may be disposed on the first opening parts 121, and remaining deposition pattern parts 131 may be disposed on the second opening parts 122. For example, some deposition pattern parts 131 of the first stick mask 130*a* that are adjacent to the frame 110 may be disposed on the first opening parts 121 and supported by the supporter 125, and remaining deposition pattern parts 131 may be disposed on the second opening parts 122 and may be adjacent to the deposition pattern parts 131 of the second stick mask 130*b*. Similarly, some deposition pattern parts 131 of the fifth stick mask 130*e* that are adjacent to the frame 100 may be disposed on the first opening parts 121, and remaining deposition pattern parts 131 may be disposed on the second opening parts 122 and may be adjacent to the deposition pattern parts 131 of the fourth mask 120*d*.

Each of a plurality of deposition pattern parts 131 of the second mask stick 130*b* through the fourth mask stick 130*d* may be disposed on a different second opening part 122, respectively. For example, some deposition pattern parts 131 of the second mask stick 130*b* may be adjacent to the deposition pattern parts 131 of the first stick mask 130*a* and remaining deposition pattern parts 131 of the third stick mask 130*c*. In this manner, adjacent deposition pattern parts 131, each from two adjacent stick masks, may be disposed on the second opening parts 122. As such, the first supporter 123 may support all the stick masks 130, whereas the second supporter 124 may support one of the stick masks 130.

A supporting part for supporting the open mask 120 may be installed under the open mask 120. The supporting part for supporting the open mask 120 may be installed in the second direction under the second opening 122 to prevent deflection of the open mask 120.

Figure 4:
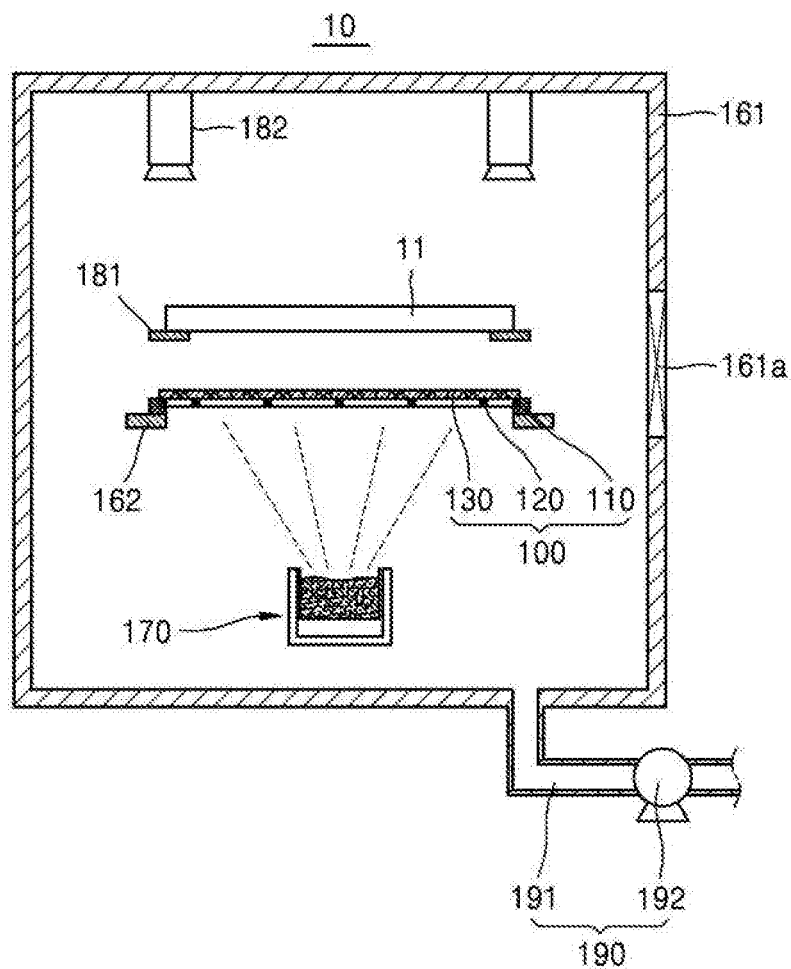
FIG. 4 is a schematic cross-sectional view of a display manufacturing apparatus including the mask frame assembly of FIG. 1, according to one or more exemplary embodiments.
Figure 5A:
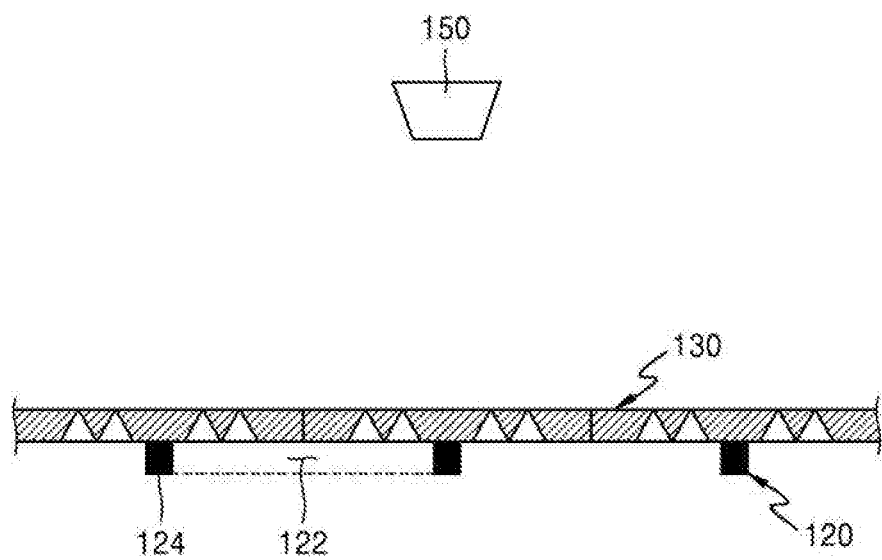
FIGS. 5A and 5B are cross-sectional views of the mask frame assembly of FIG. 1 being cleaned, according to one or more exemplary embodiments.
Figure 5B:
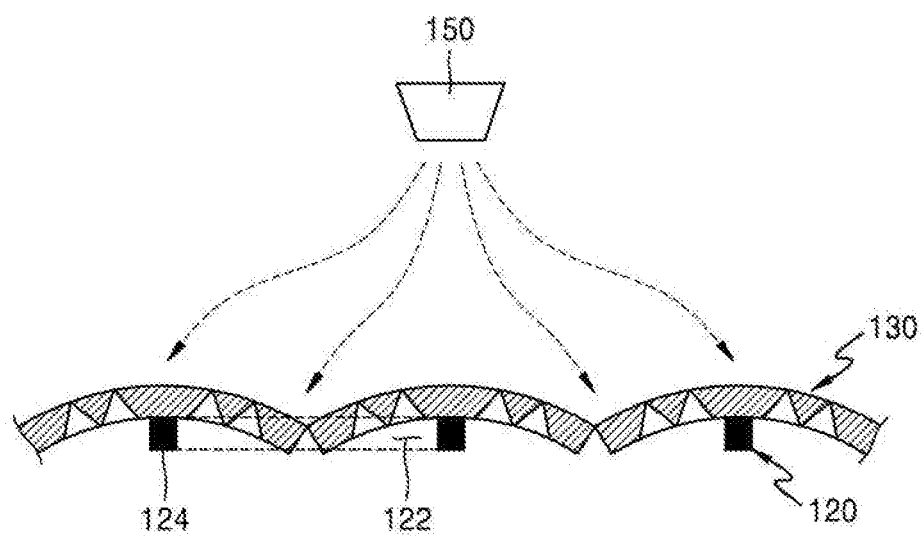

FIG. 4 is a schematic cross-sectional view of a display manufacturing apparatus including the mask frame assembly of FIG. 1, according to one or more exemplary embodiments. FIGS. 5A and 5B are cross-sectional views of the mask frame assembly of FIG. 1 being cleaned, according to one or more exemplary embodiments.

Referring to FIGS. 4, 5A, and 5B, a method of manufacturing an organic light-emitting display apparatus 200 (described in more detail in association with FIG. 6) using the mask frame assembly 100 of FIG. 1 will be described.

Manufacturing an organic light-emitting display apparatus 200 may include disposing the open mask 120 in an inner space 112 of the frame 110, disposing the plurality of stick masks 130 on the open mask 120, installing the mask frame assembly 100 to the frame 110 by fixing ends of the plurality of stick masks 130 to the frame 110, loading a substrate 11 in display manufacturing apparatus 10 via substrate supporting part 181, depositing a deposition material on the substrate 11 via a deposition source 170 disposed under the mask frame assembly 100, unloading the substrate 11 from the display manufacturing apparatus 10, and spraying gases toward the plurality of stick masks 130 via a blower 150 disposed above the mask frame assembly 100.

The display manufacturing apparatus (e.g., a deposition apparatus for manufacturing a display apparatus) 10 may include the mask frame assembly 100, a chamber 161, a mounting part 162, the deposition source 170, the substrate supporting part 181, and a vision part 182. The mask frame assembly 100 may be the mask frame assembly 100 illustrated in FIG. 1. Although specific reference will be made to this particular implementation, it is also contemplated that display manufacturing apparatus 10 may embody many forms and include multiple and/or alternative components.

The chamber 161 may have an inner, pressurized space, and a portion of the chamber 161 may be open. A gate valve 161a, etc., may be installed in the open portion of the chamber 161, to open and close the open portion. The mask frame assembly 100 may be mounted on the mounting part 162, which may be configured to rotate and/or linearly move the mask frame assembly 100. A deposition material may be loaded in the deposition source 170, and evaporated and/or sublimated in the deposition source 170. The evaporated or sublimated deposition material may be deposited on the substrate 11 via the open mask 120 and the plurality of stick masks 130. The substrate supporting part 181 may support the substrate 11.

The display manufacturing apparatus 10 may deposit a deposition material on the substrate 11 in a state in which the substrate 11 is supported. According to one or more exemplary embodiments, the deposition material may be deposited on the substrate 11 while one or both of the substrate 11 and the deposition source 170 move relative to each other. For descriptive convenience, an example in which the deposition material is deposited on the substrate 11 in the state in which the substrate 11 is supported will be discussed.

A pressure adjusting part 190 may be connected to the chamber 161. The pressure adjusting part 190 may include a connection pipe 191 connected to the chamber 161, and a pump 192 installed in (or otherwise connected to) the connection pipe 191. The pressure adjusting part 190 may be utilized to pressurize an interior environment of the chamber 161, such as to provide a vacuum environment for a deposition process.

The display manufacturing apparatus 10 may be utilized to form an organic layer, an inorganic layer, or a metal layer of, for instance, an organic light-emitting display apparatus. For descriptive convenience, an example in which the display manufacturing apparatus 10 forms an organic layer will be described. For instance, the example in which the display manufacturing apparatus 10 forms an intermediate layer 282 among organic layers of organic light-emitting display apparatus 200 will be described.

According to one or more exemplary embodiments, the substrate 11 and the mask frame assembly 100 may be loaded into the chamber 161 from the outside of the chamber 161 and may be supported by the substrate supporting part 181 and the mounting part 162, respectively. After locations of the mask frame assembly 100 and the substrate 11 are initially established and measured via the vision part 182, the substrate 11 and the mask frame assembly 100 may be arranged by adjusting the mounting part 162. The vision part 182 may include a camera for photographing the mask frame assembly 100 and the substrate 11, however, any other suitable imaging device may be utilized in association with exemplary embodiments.

After the mask frame assembly 100 and the substrate 11 are arranged, a deposition material may be evaporated or sublimated by driving the deposition source 170. The deposition material may be deposited on the substrate 11 by passing through the first opening part 121 or the second opening part 122 of the open mask 120 and by passing through the deposition pattern parts 131 of the plurality of stick masks 130. Then, the substrate 11, on which the deposition material has been deposited, may be drawn to the outside of the chamber 161 to perform one or more other manufacturing and/or verification processes.

After the deposition process, a cleaning process may be performed on the mask frame assembly 100. The cleaning process of the mask frame assembly 100 may be performed in another space by removing the mask frame assembly 100 from the chamber 161 or may be performed in the chamber 161 using a cleaning device. For instance, a blower 150 may spray gases toward the plurality of stick masks 130 to remove particles deposited on the plurality of stick masks 130 during the deposition process. The particles may be bonded to surfaces of the stick masks 130, and, as such, to remove the particles, the sprayed gases may have greater pressure than a pressure that a mask stick may withstand.

For instance, when gases are sprayed on the mask frame assembly 100, a plurality of stick masks 130 may be bent or folded. When, for example, a supporter to support an outer edge of the stick masks 130, that is, a boundary in which a first stick mask contacts an adjacent stick mask (for example, when there is a supporter between the second opening parts 122), the boundary in which the first stick mask contacts the adjacent stick mask may be bent or folded due to a force from the supporter and a pressure of the gases sprayed from the blower 150. In this manner, the presence of the supporter may cause a crease (or other permanent deformation) of the stick mask. When the stick masks 130 are bent or folded, a deposition pattern may not be formed precisely on the substrate 11. Due to the deformation of the stick mask 130, a gap between the substrate 11 and the stick mask 130 may be generated so that a shadow phenomenon may occur during the deposition process.

Referring to FIG. 5B, a boundary in which a first stick mask contacts an adjacent stick mask is not supported by the open mask 120, according to one or more exemplary embodiments. Since there is no supporter under the boundary in which a first stick mask contacts the adjacent stick mask, when gases are sprayed from the blower 150, the plurality of stick masks 130 may move in a vertical direction due to elasticity of the stick masks 130. That is, since there is no supporter to support the outer edge of the stick masks, the outer edge may elastically move in an inner space of the second opening part 122. Thereafter, when spraying the gases by the blower 150 is complete, the stick masks 130 may restore their positions due to elasticity. In other words, the lack of the above-noted supporter may prevent permanent deformation of the plurality of stick masks 130. Accordingly, the plurality of stick masks 130 may not be adversely deformed as a result of the cleaning process, e.g., the gases spraying process.

According to one or more exemplary embodiments, the mask frame assembly 100 does not have a supporter to support the boundary in which the plurality of stick masks 130 contacts one another. Thus, the mask frame assembly 100 is not permanently deformed from the forces of the cleaning process. To this end, the mask frame assembly 100 may increase an efficiency of the cleaning process and may have the improved durability. Further, the mask frame assembly 100 may be used to manufacture an organic light-emitting display apparatus having a high resolution.

Figure 6:
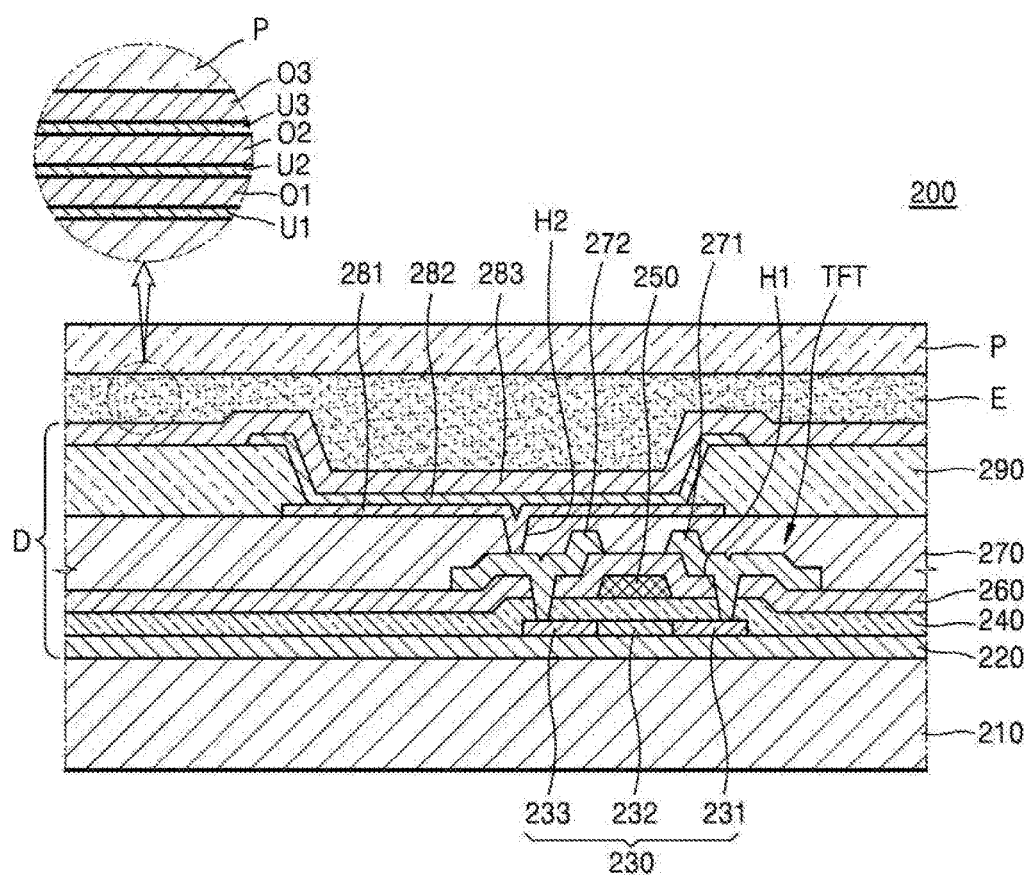
FIG. 6 is a cross-sectional view of a portion of an organic light-emitting display apparatus manufactured using the display manufacturing apparatus of FIG. 4, according to one or more exemplary embodiments.

FIG. 6 is a cross-sectional view of a portion of an organic light-emitting display apparatus manufactured using the display manufacturing apparatus of FIG. 4, according to one or more exemplary embodiments. For instance, the portion of the OLED display apparatus 200 may be a pixel (or sub-pixel) of the OLED display apparatus 200. Hereinafter, an example in which the portion corresponds to a sub-pixel is described in more detail.

According to one or more exemplary embodiments, sub-pixels of the OLED display apparatus 200 may include at least one thin-film transistor TFT, and an organic light-emitting device. The thin-film transistor TFT is not limited to having a structure shown in FIG. 6, and a number and a structure of the thin-film transistor TFT may be variously modified. As seen in FIG. 6, the OLED display apparatus 200 may include a substrate 210, a display unit D, an encapsulation unit E, and a protection layer P.

The substrate 210 may be formed of a flexible insulating material. For example, the substrate 210 may be a polymer substrate formed of polyimide (PI), polycarbonate (PC), polyethersulphone (PES), polyethylene terephthalate (PET), polyethylene naphthalate (PEN), polyarylate (PAR), fiber glass reinforced plastic (FRP), and/or the like. According to one or more exemplary embodiments, the substrate 210 may be a glass substrate having a thickness to such a degree that the substrate 210 may be bent. The substrate 210 may be formed of a metal material. The substrate 210 may be transparent, translucent, or opaque.

A buffer layer 220 formed of an organic compound and/or an inorganic compound may be further formed on a top surface of the substrate 210. The buffer layer 220 may obstruct oxygen and moisture, and may planarize a surface of the substrate 210. The buffer layer 220 may be formed of a material selected from an inorganic material, such as silicon dioxide ($SiO_2$), silicon nitride ($SiN_x$), silicon oxynitride ($SiO_xN_y$), aluminum oxide ($AlO_x$), or aluminum oxynitride ($AlO_xN_y$), or an organic material, such as acryl, polyimide, or polyester.

The thin-film transistor TFT may be formed on the buffer layer 220. According to one or more exemplary embodiments, the thin-film transistor TFT refers to a top gate transistor; however, a thin-film transistor having another structure, such as a bottom gate transistor, may be included as the thin-film transistor TFT.

After an active layer 230 having a certain pattern is formed on the buffer layer 220, the active layer 230 is buried by a gate insulating layer 240. The active layer 230 has a source area 231 and a drain area 233, and further includes a channel area 232 therebetween. The active layer 230 may be formed to contain various materials. For example, the active layer 230 may contain an inorganic semiconductor material, such as amorphous silicon or crystalline silicon. As another example, the active layer 230 may contain an oxide semiconductor. For instance, an oxide semiconductor may include an oxide of a material selected from a metal element in a group 12, 13, or 14, such as zinc (Zn), indium (In), gallium (Ga), tin (Sn), cadmium (Cd), germanium (Ge), or hafnium (Hf), or a combination thereof. Hereinafter, an example in which the active layer 230 is formed of amorphous silicon is described in detail.

A gate electrode 250 corresponding to the active layer 230 and an interlayer insulating layer 260 that buries the gate electrode 250 are formed on a top surface of the gate insulating layer 240. After a contact hole H1 is formed on the interlayer insulating layer 260 and the gate insulating layer 240, a source electrode 271 and a drain electrode 272 are formed on the interlayer insulating layer 260 to respectively contact the source area 231 and the drain area 233.

A passivation layer 270 is formed on a top surface of the thin-film transistor TFT, and a pixel electrode 281 of the OLED display apparatus 200 is formed on the passivation layer 270. The pixel electrode 281 may be a transparent (or translucent) electrode or a reflective electrode. If the pixel electrode 281 is a transparent (or translucent) electrode, the pixel electrode 281 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). If the pixel electrode 281 is a reflective electrode, the pixel electrode 281 may include a reflective layer formed of silver (Ag), magnesium (Mg), Al, platinum (Pt), palladium (Pd), gold (Au), nickel (Ni), neodymium (Nd), iridium (Ir), chrome (Cr), or a compound thereof, and a layer formed of ITO, IZO, ZnO, or $In_2O_3$. However, a constitution and a material of the pixel electrode 281 is not limited thereto, and may be variously modified.

The pixel electrode 281 contacts the drain electrode 272 of the thin-film transistor (TFT) via a contact hole H2 formed in the passivation layer 270. The passivation layer 270 may be formed of an inorganic and/or organic material, or formed to have a single layer or two or more layers. The passivation layer 270 may be formed as a planarization layer so that a top surface is smooth regardless of unevenness of a lower layer. However, the passivation layer 270 may also be formed to be uneven according to unevenness of a layer below the passivation layer 270. In addition, the passivation layer 270 may be formed of a transparent insulator so that a resonant effect may be obtained.

After the pixel electrode 281 is formed on the passivation layer 270, a pixel-defining layer 290 is formed of an organic and/or inorganic material to cover the pixel electrode 281 and the passivation layer 270, and to have an opening to expose the pixel electrode 281. In addition, an intermediate layer 282 and an opposite electrode 283 are formed on the pixel electrode 281. The pixel electrode 281 functions as an anode electrode, and the opposite electrode 283 functions as a cathode electrode. However, polarities of the pixel electrode 281 and the opposite electrode 283 may be changed with each other. The pixel electrode 281 and the opposite electrode 283 are insulated from each other by the intermediate layer 282. An organic emission layer emits light as voltages having different polarities from each other are applied to the intermediate layer 282.

The intermediate layer 282 may include an organic emission layer. As another selective example, the intermediate layer 282 may include the organic emission layer, and further include at least one selected from the group consisting of a hole injection layer (HIL), a hole transport layer (HTL), an electron transport layer (ETL), and an electron injection layer (EIL).

Although a light emitting material is separately included in the respective pixels in the organic light emission layer according to exemplary embodiments as descried above, the present inventive concept is not limited thereto. The organic light emission layer may be a common organic light emission layer usable for the entire pixels regardless of locations of the pixels. Here, the organic light emission layer may include light emitting materials to respectively emit red light, green light, and blue light, for example. The light emitting materials may be stacked in a vertical direction or disposed in a mixed manner. The light emitting materials may include materials to emit a combination of different colors as long as white light is emitted from the combination of the different colors. A color conversion layer or a color filter may be further included to convert the emitted white light to a certain color.

After the display unit D is formed on the substrate 210, the encapsulation layer E may be formed on the display unit D. The encapsulation layer E may include a plurality of inorganic layers, or an inorganic layer and an organic layer. For instance, an organic layer of the encapsulation layer E is formed of a polymer material, and may be a single layer formed of one selected from polyethylene terephthalate, polyimide, polycarbonate, epoxy, polyethylene, and polyacrylate, or layers in which such materials are stacked on top of each other. The organic layer may be formed of polyacrylate, and may include a material obtained by polymerizing a monomer composition that includes diacrylate-based monomer and triacrylate-based monomer. Monoacrylate-based monomer may be further included in the monomer composition. A well-known photoinitiator, such as a thermoplastic polyolefin (TPO), may be included in the monomer composition. However, the monomer composition is not limited thereto, and may include epoxy, polyimide, polyethylene terephthalate, polycarbonate, polyethylene, or polyacrylate.

The organic layer included in the encapsulation layer E may be a single layer or stacked layers that include metal oxide or metal nitride. For example, the inorganic layer may include one selected from $SiO_2$, SiNx, $Al_2O_3$, titanium oxide ($TiO_2$), zirconium oxide (ZrOx), and ZnO. An uppermost layer in the encapsulation layer E, exposed to an outside, may be formed of an inorganic layer to prevent moisture from penetrating into the OLED.

The encapsulation layer E may include at least one sandwich structure in which at least one organic layer is inserted between at least two inorganic layers. As another example, the encapsulation layer E may include at least one sandwich structure in which at least one inorganic layer is inserted between at least two organic layers. For example, as seen in an enlarged portion P, the encapsulation layer E may include a first inorganic layer U1, a first organic layer O1, a second inorganic layer U2, a second organic layer O2, a third inorganic layer U3, and a third organic layer O3 sequentially formed from a top of the OLED.

A halogenated metal layer that includes lithium-fluoride (LiF) may be further included between the OLED and the first inorganic layer U1. The halogenated metal layer may prevent damage to the OLED when the first inorganic layer U1 is formed using, for example, a sputtering method. An area of the first organic layer O1 may be smaller than an area of the second inorganic layer U2, and an area of the second organic layer O2 may be smaller than an area of the third inorganic layer U3. However, the encapsulation layer E is not limited thereto, and may include any structure in which an inorganic layer and an organic layer are stacked on top of each other in various forms.

The protection layer P may be formed on the encapsulation layer E. The protection layer P may be formed using various methods. For example, the protection layer P may be formed using a sputtering method, an ion beam deposition method, an evaporation method, a general chemical vapor deposition method, or the like. The protection layer P may include a metallic oxide or nitride, such as $SiN_x$, $SiO_xN_y$, titanium oxide ($TIO_x$), titanium nitride ($TIN_x$), titanium oxynitride ($TiO_xN_y$), $ZrO_x$, tantalum nitride ($TaN_x$), tantalum oxide ($TaO_x$), hafnium oxide ($HfO_x$), $AlO_x$, or the like. The protection layer P may be formed to completely surround a side of the encapsulation layer E. Accordingly, the protection layer P may increase life expectancy of the encapsulation layer E by obstructing the encapsulation layer E from moisture or oxygen.

According to one or more exemplary embodiments, the OLED display apparatus 200 may be applied to an organic light-emitting display apparatus having flexibility and an organic light-emitting display apparatus having rigidity.

According to one or more exemplary embodiments, a mask frame assembly and a method of manufacturing an organic light-emitting display apparatus using the mask frame assembly may include an open mask that does not support a portion of stick masks, and, in this manner, the durability of the mask frame assembly may be improved. Further, the organic light-emitting display apparatus may be manufactured with relatively high resolution and relatively greater precision at reduced cost.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light-emitting display apparatus, the method comprising:
   causing, at least in part, a deposition material to be deposited on a substrate of the organic light-emitting display apparatus according to deposition patterns formed in a mask frame assembly, the mask frame assembly comprising:
   a frame;
   an open mask on the frame; and
   stick masks disposed on the open mask and coupled to the frame, the deposition patterns being formed in the stick masks and overlapping openings in the open mask; and
   causing, at least in part, gases to be sprayed toward the stick masks after depositing the deposition material on the substrate.

2. The method of claim 1, wherein the openings comprise:
   first openings disposed in association with opposing ends of the open mask; and
   second openings disposed between the first openings, the second openings being larger than the first openings.

3. The method of claim 2, wherein:
   some of the deposition patterns overlap the first openings; and
   a remaining some of the deposition patterns overlap the second openings.

4. The method of claim 2, wherein:
   a first stick mask of the stick masks comprises first deposition patterns of the deposition patterns;
   some of the first deposition patterns overlap some of the first openings; and
   a remaining some of the first deposition patterns overlap some of the second openings.

5. The method of claim 4, wherein:
   a second stick mask of the stick masks is disposed adjacent to the first stick mask;
   the second stick mask comprises second deposition patterns of the deposition patterns;
   each of the second deposition patterns overlaps only a second opening of the second openings.

6. The method of claim 2, wherein an area of each second opening of the second openings is twice as large as an area of each first opening of the first openings.

7. The method of claim 2, wherein the sprayed gases cause:
   deposition material deposited on the stick masks to be removed; and
   the stick masks to elastically deform into the openings.

* * * * *